United States Patent
Hiruta et al.

(10) Patent No.: US 10,295,995 B2
(45) Date of Patent: May 21, 2019

(54) MACHINE DIAGNOSTIC APPARATUS AND MACHINE DIAGNOSTIC METHOD

(71) Applicant: HITACHI, LTD., Tokyo (JP)

(72) Inventors: Tomoaki Hiruta, Tokyo (JP); Kohji Maki, Tokyo (JP); Tetsuji Kato, Tokyo (JP); Yoshitaka Atarshi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 62 days.

(21) Appl. No.: 15/544,298

(22) PCT Filed: Jan. 20, 2015

(86) PCT No.: PCT/JP2015/051341
§ 371 (c)(1),
(2) Date: Jul. 18, 2017

(87) PCT Pub. No.: WO2016/117021
PCT Pub. Date: Jul. 28, 2016

(65) Prior Publication Data
US 2018/0011480 A1 Jan. 11, 2018

(51) Int. Cl.
*G05B 23/02* (2006.01)
*G01R 31/34* (2006.01)

(52) U.S. Cl.
CPC ..... *G05B 23/0208* (2013.01); *G05B 23/0227* (2013.01); *G01R 31/343* (2013.01)

(58) Field of Classification Search
CPC ............................ G05B 23/0208; G05B 23/02
USPC ....................................................... 702/183
See application file for complete search history.

(56) References Cited

U.S. PATENT DOCUMENTS

| | | | | |
|---|---|---|---|---|
| 5,739,698 A | * | 4/1998 | Bowers | G01R 23/20 324/545 |
| 9,983,576 B2 | * | 5/2018 | Czerniak | G01M 13/028 |
| 2007/0244841 A1 | * | 10/2007 | Vatchkov | E02F 9/26 706/16 |
| 2015/0346066 A1 | * | 12/2015 | Dutta | G01M 99/008 702/183 |

(Continued)

FOREIGN PATENT DOCUMENTS

| JP | 2000-259222 A | 9/2000 |
|---|---|---|
| JP | 2002-182736 A | 6/2002 |

(Continued)

OTHER PUBLICATIONS

Japanese Office Action dated Feb. 6, 2018 for the Japanese Application No. 2016-570237.

(Continued)

*Primary Examiner* — Hien D Khuu
(74) *Attorney, Agent, or Firm* — Volpe and Koenig, P.C.

(57) ABSTRACT

An operation mode specifying unit specifies an operation mode of a machine by comparing time-series data of an amplitude and a frequency of measurement data obtained from a sensor with definition data of the operation mode of the machine created in advance by an operation mode data creation unit. In addition, an abnormality diagnosis unit performs processing of cluster analysis for the measurement data obtained from the sensor or the like, and diagnoses abnormality of the machine according to diagnosis procedure information that is set in advance depending on the set operation mode and an abnormality mode of the machine.

8 Claims, 12 Drawing Sheets

(56) References Cited

U.S. PATENT DOCUMENTS

2018/0059656 A1\* 3/2018 Hiruta .................... G05B 23/02
2018/0354353 A1\* 12/2018 Dudar ................... F02D 41/021

FOREIGN PATENT DOCUMENTS

| JP | 2004-070424 A | 3/2004 |
|----|---------------|--------|
| JP | 2004-227357 A | 8/2004 |
| JP | 2013-061695 A | 4/2013 |
| JP | 5530045 B2 | 6/2014 |
| JP | 2015-088154 A | 5/2015 |

OTHER PUBLICATIONS

International Search Report, PCT/JP2015/051341, dated Mar. 31, 2015, 1 pg.
Japanese Office Action dated Aug. 28, 2018 for the Japanese Patent Application No. 2016-570237.

\* cited by examiner

| MEASUREMENT TIME | CURRENT | VIBRATION A | VIBRATION B | TEMPERATURE |
|---|---|---|---|---|
| 2014/9/27 10:00:00.0 | 0.1A | 1m/s² | -5m/s² | 20 DEGREES |
| 2014/9/27 10:00:00.1 | 0.2A | 4m/s² | 3m/s² | 20 DEGREES |
| 2014/9/27 10:00:00.2 | 0.3A | 8m/s² | 2m/s² | 20 DEGREES |
| ... | ... | ... | ... | ... |
| ... | ... | ... | ... | ... |

| NAME OF OPERATION MODE | TIME | SENSOR | AMPLITUDE | FREQUENCY | OPERATION MODE ID |
|---|---|---|---|---|---|
| STARTING OPERATION MODE | 10 SECONDS | CURRENT | 0→10 | 50Hz | 1 |
| STEADY OPERATION MODE | 3 SECONDS | CURRENT | 10 | 50Hz | 2 |
| ACCELERATION OPERATION MODE | 10 SECONDS | CURRENT | 10 | 50Hz→80Hz | 3 |
| ... | ... | ... | ... | ... | ... |

STARTING OPERATION MODE

STEADY OPERATION MODE

ACCELERATION OPERATION MODE

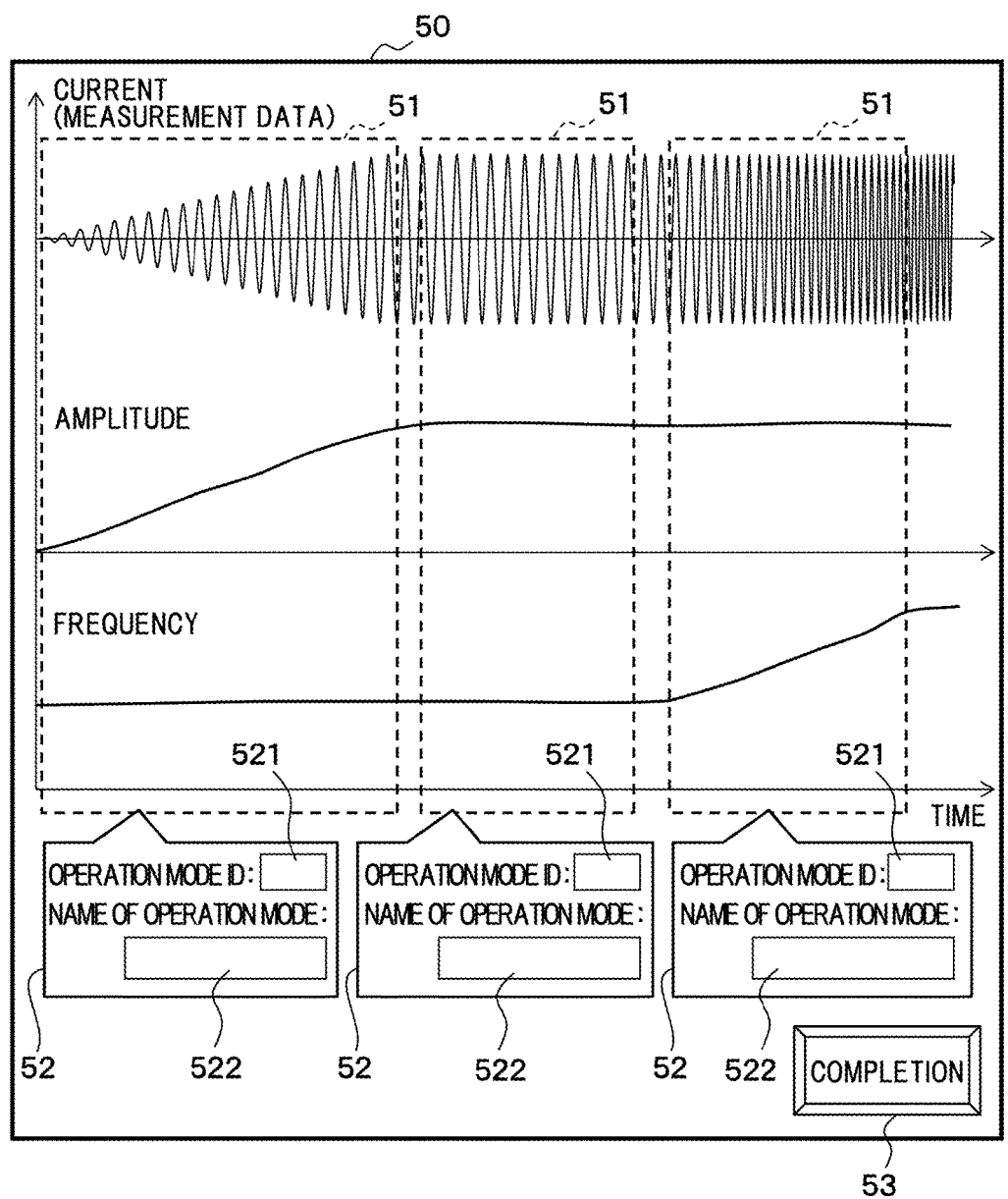

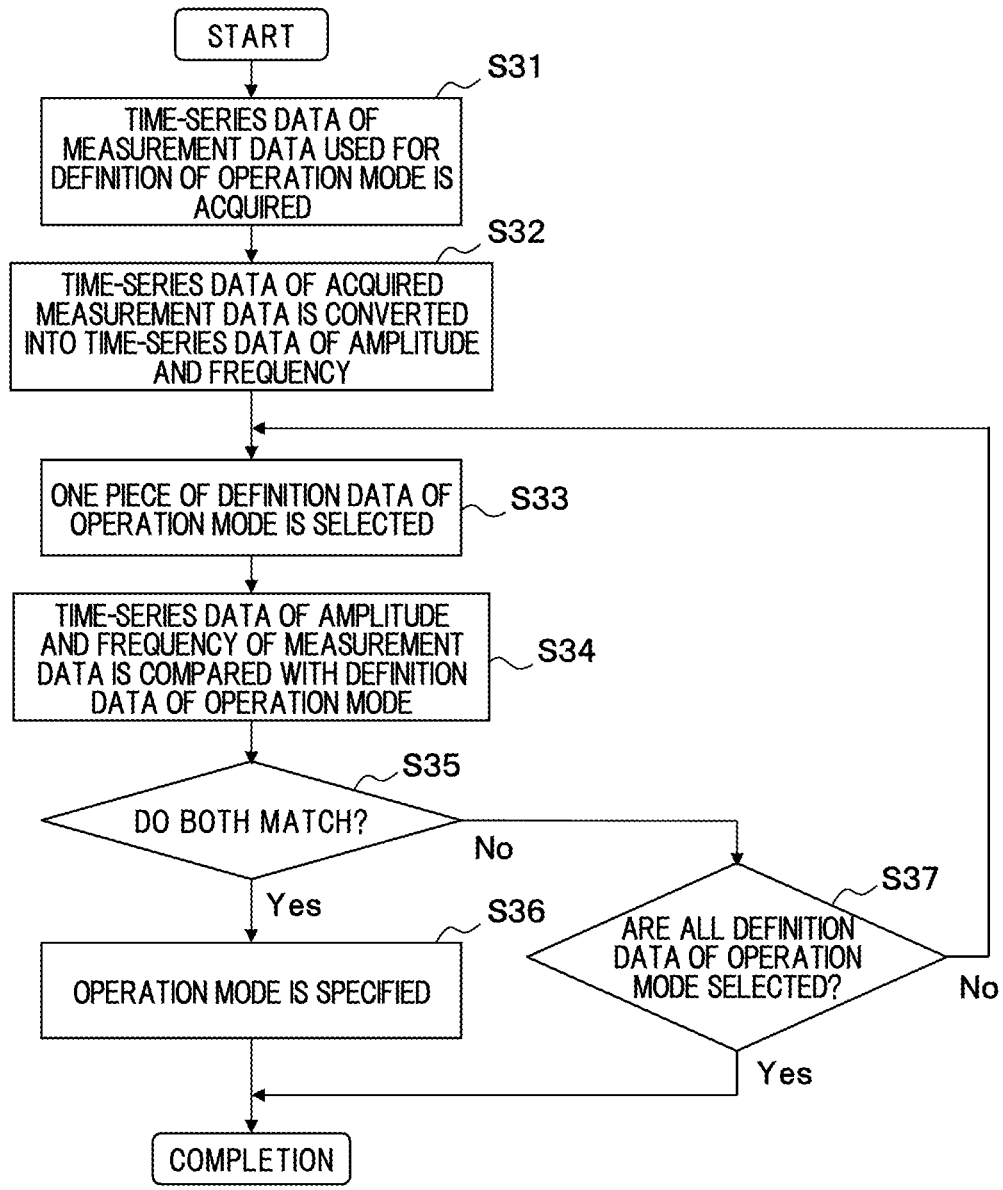

FIG. 9

| ABNORMALITY MODE | OPERATION MODE ID | DIAGNOSIS PROCEDURE ID |
|---|---|---|
| SCRATCH IN INNER RING OF BEARING | 1, 2 | 1 |
| SCRATCH IN OUTER RING OF BEARING | 1, 2 | 2 |
| DEGRADATION OF INSULATOR OF STATOR | 3 | 3 |
| .... | ... | ... |

| DIAGNOSIS PROCEDURE ID | 1 |
|---|---|
| SENSOR | VIBRATION A TEMPERATURE |
| PRE-PROCESSING | FREQUENCY ANALYSIS (VIBRATION A) |
| ALGORITHM | K AVERAGE METHODK CLUSTER INFORMATION (Datafile0) |
| POST-PROCESSING | ABNORMALITY DEGREE≥3 AND CONTINUES 3 SECONDS OR MORE |

FIG. 12

| < ABNORMALITY OCCURRENCE SITUATION LIST > | | | |
|---|---|---|---|
| OCCURRENCE TIME | ABNORMALITY MODE | OPERATION MODE | ABNORMALITY DEGREE |
| 2014-9-27 15:10:00 | SCRATCH IN INNER RING OF BEARING | NORMAL OPERATION | 8 |
| 2014-9-27 15:05:00 | SCRATCH IN INNER RING OF BEARING | NORMAL OPERATION | 10 |
| 2014-9-27 15:00:00 | SCRATCH IN INNER RING OF BEARING | NORMAL OPERATION | 9 |
| ..... | ... | ... | ... |

DETAIL DISPLAY  COMPLETION

MACHINE DIAGNOSTIC APPARATUS AND MACHINE DIAGNOSTIC METHOD

TECHNICAL FIELD

The present invention relates to a machine diagnostic apparatus that diagnoses abnormality of a machine and a machine diagnostic method.

BACKGROUND ART

A machine for social infrastructure such as a power generation gas turbine is required to operate 24 hours a day. In order to maintain high availability of such a machine, it is necessary to prevent unplanned outages. For that purpose, it is necessary to change a maintenance method from a periodic maintenance based on an operating time of the machine of the related art to a state monitoring and maintenance that appropriately performs preventive maintenance based on a state of the machine.

In order to realize the state monitoring and maintenance, a role of a machine diagnostic apparatus, which analyzes sensor data collected via various sensors provided in the machine in accordance with a predetermined abnormality diagnosis procedure and diagnoses prediction of abnormality or failure of the machine, is important. Here, the abnormality diagnosis procedure refers to a processing flow of a computer that processes data acquired from one or more sensors and diagnoses the prediction of abnormality of the machine based on the processing result.

Normally, the machine subjected to such diagnosis has a plurality of operation modes. Generally, sensor values that are obtained from sensors provided in the machine are different for each operation mode. Therefore, in the abnormality diagnosis procedure of the machine diagnostic apparatus, it is inevitable to consider the operation mode of the machine. That is, the abnormality diagnosis procedure that does not take into consideration the operation mode of the machine leads to a false report or a report failure of a diagnosis result. Moreover, the false report is a case where a normal state of the machine is diagnosed as abnormal and the report failure is a case where an abnormal state of the machine is diagnosed as normal.

Therefore, even in the machine diagnostic apparatus of the related art, the operation mode of the machine is taken into consideration. For example, in PTL 1, as a precedent example of the machine diagnostic apparatus in consideration of the operation mode, a facility diagnostic apparatus is disclosed in which "each of differences in an operation state of each device configuring a facility including a plurality of devices provided within one room or the like is regarded as a difference of all the operation modes, reference data of an inverse filter or the like is obtained for each operation mode, and in the determination of the presence or absence of abnormality, the determination of the presence or absence of abnormality is performed based on a signal obtained at that time and the reference data that is obtained for the same operation mode as the operation mode at that time" is disclosed.

CITATION LIST

Patent literature

PTL 1: JP-A-2002-182736

SUMMARY OF INVENTION

Technical Problem

In addition, the paragraph 0052 of PTL 1 also describes that "code acquisition unit 312 receives a code representing a current operation mode of a diagnosis target facility configured of a plurality of compressors 12 to 17 disposed in a compressor chamber 10 from a control computer 20 illustrated in FIG. 1". This means that in the facility diagnostic apparatus disclosed in PTL 1, the operation mode of the diagnosis target facility (machine) is supplied from the control computer of the facility (machine) (see FIG. 1 of PTL 1).

However, acquiring the operation mode of the facility (machine) from the control computer is not necessarily easy, for example, in a case where a new machine diagnostic apparatus is added to an existing machine. In particular, in a case where a manufacturer of the newly added machine diagnostic apparatus is different from a manufacturer of the control computer of the existing machine, it can be said that it is very difficult to add a new signal line or program for outputting the operation mode to the control computer. Therefore, it is substantially difficult for the newly added machine diagnostic apparatus to acquire the operation mode from the existing control computer.

As described above, there is a technical problem that the machine (facility) diagnostic apparatus of the related art is practically difficult to apply to the existing machine. Therefore, an object of the invention is to provide a machine diagnostic apparatus and a machine diagnostic method also capable of applying to an existing machine of which control specifications are unknown.

Solution to Problem

A machine diagnostic apparatus according to the invention includes a sensor data acquisition unit that acquires time-series measurement data measured by a sensor from the sensor attached to a machine having one or more operation modes; an operation mode data creation unit that creates operation mode data defining the operation mode of the machine based on time-series data of an amplitude and a frequency of at least one piece of time-series measurement data acquired in the past via the sensor data acquisition unit, and stores the operation mode data in a storage device; an operation mode specifying unit that specifies the operation mode of the machine by comparing the time-series data of the amplitude and the frequency of the measurement data to the operation mode data stored in the storage device when acquiring the time-series measurement data via the sensor data acquisition unit; and an abnormality diagnosis unit that processes the time-series measurement data acquired via the sensor data acquisition unit and diagnoses abnormality of the machine according to diagnosis procedure information that is set in advance depending on the operation mode that is specified in the operation mode specifying unit and an abnormality mode of the machine.

Advantageous Effects of Invention

According to the invention, the machine diagnostic apparatus and the machine diagnostic method also capable of applying to an existing machine of which control specifications are unknown are provided.

BRIEF DESCRIPTION OF DRAWINGS

FIG. 3 is a diagram illustrating an example of a configuration of sensor data stored in a sensor data storage unit.

FIG. 4 is a diagram illustrating an example of a configuration of operation mode data stored in an operation mode data storage unit.

FIG. 7 is a diagram illustrating an example of an operation mode definition screen displayed by the process in the operation mode data creation unit.

FIG. 8 is a diagram illustrating an example of a process flow executed by an operation mode specifying unit.

FIG. 9 is a diagram illustrating an example of a configuration of abnormality mode data stored in an abnormality mode data storage unit.

FIG. 10 is a diagram illustrating an example of a configuration of diagnosis procedure information stored in a diagnosis procedure information storage unit.

FIG. 12 is a diagram illustrating an example of a diagnosis result display screen displayed to a display device by the abnormality diagnosis unit.

DESCRIPTION OF EMBODIMENTS

Hereinafter, an embodiment of the invention will be described in detail with reference to the drawings.

Figure 1:
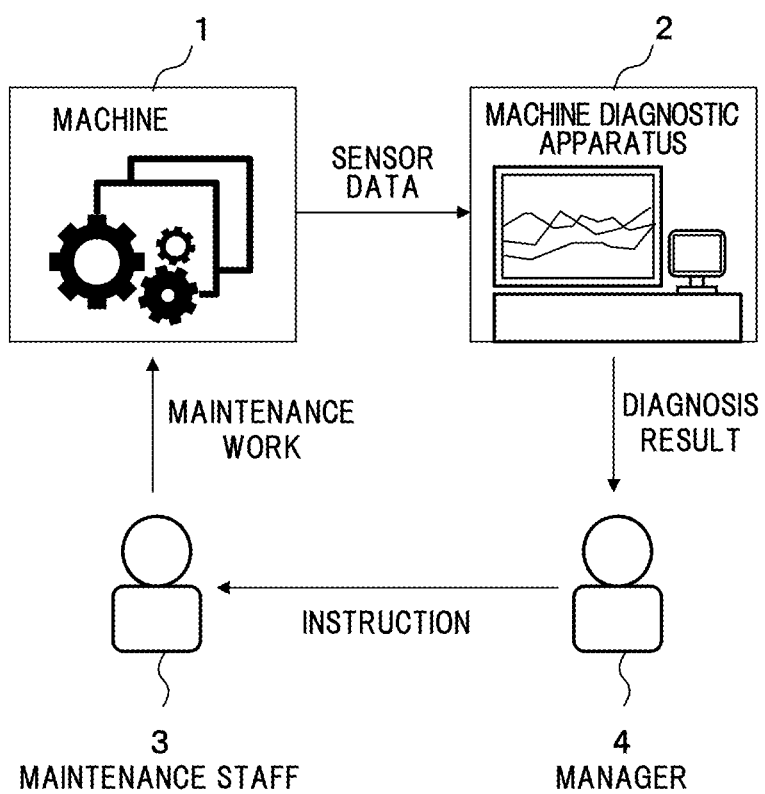
FIG. 1 is a view illustrating an example of an action performed by a machine, a machine diagnostic apparatus, a maintenance staff, and a manager in an embodiment of the invention.

FIG. 1 is a view illustrating an example of an action performed by a machine 1, a machine diagnostic apparatus 2, a maintenance staff 3, and a manager 4 in an embodiment of the invention. The machine 1 is a monitoring target device that is monitored by the machine diagnostic apparatus 2 and maintenance work is performed by the maintenance staff 3 periodically or when the machine diagnostic apparatus 2 detects abnormality or prediction of abnormality (hereinafter, simply referred to as abnormality). Various sensors (not illustrated) (sensor 11 in FIG. 2) are mounted on the machine 1 and various types of measurement data of the machine 1 measured by various sensors are output to the machine diagnostic apparatus 2.

The machine diagnostic apparatus 2 collects and aggregates the measurement data measured by various sensors from the machine 1, diagnoses the presence or absence of abnormality in the machine 1 periodically according to a predetermined abnormality diagnosis procedure, and notifies the manager 4 of a diagnosis result thereof. The manager 4 instructs the on-site maintenance staff 3 to perform maintenance work of the machine 1 when knowing the abnormality or a cause (contents of failure) of the abnormality of the machine 1 based on notification of the diagnosis result from the machine diagnostic apparatus 2.

Figure 2:
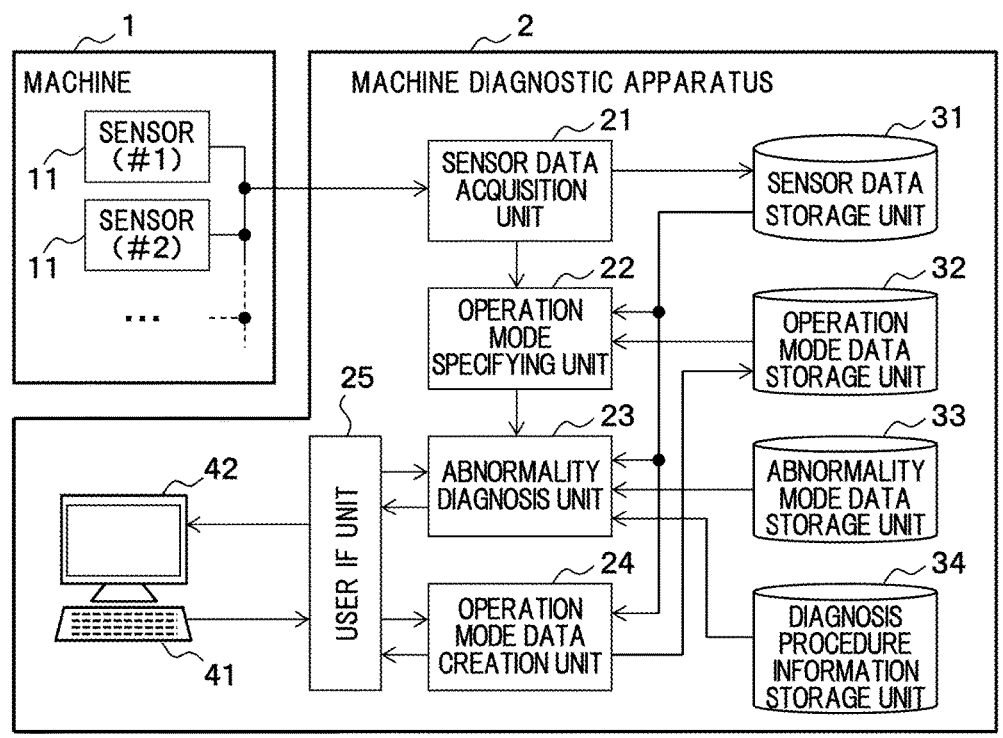
FIG. 2 is a diagram illustrating an example of a functional block configuration of the machine diagnostic apparatus according to the embodiment of the invention.

FIG. 2 is a diagram illustrating an example of a functional block configuration of the machine diagnostic apparatus 2 according to the embodiment of the invention. As illustrated in FIG. 2, the machine diagnostic apparatus 2 is configured to include a sensor data acquisition unit 21, an operation mode specifying unit 22, an abnormality diagnosis unit 23, an operation mode data creation unit 24, a user IF unit 25, a sensor data storage unit 31, an operation mode data storage unit 32, an abnormality mode data storage unit 33, a diagnosis procedure information storage unit 34, and the like.

In addition, the machine diagnostic apparatus 2 as hardware is configured of a so-called computer including a calculation processing device (microprocessor or the like: not illustrated), a storage unit (semiconductor memory, a hard disk device, or the like: not illustrated), an input device 41 (keyboard, a mouse, or the like), and a display device 42 (a liquid crystal display device or the like).

Here, each function of the sensor data acquisition unit 21, the operation mode specifying unit 22, the abnormality diagnosis unit 23, the operation mode data creation unit 24, and the user IF unit 25 is realized by executing a predetermined program stored in the storage device by the calculation processing device. In addition, the sensor data storage unit 31, the operation mode data storage unit 32, the abnormality mode data storage unit 33, and the diagnosis procedure information storage unit 34 are configured by storing predetermined data in the storage device.

Moreover, in the embodiment, the machine 1 that is the diagnosis target of the machine diagnostic apparatus 2 may be any device as long as the device performs a mechanical operation thereby realizing a desired function. However, in the embodiment, in order to make the contents of the invention easy to understand, the machine 1 is, for example, an electric motor itself, or a device having a mechanical unit driven by the electric motor. The electric motor is a main part attached to many production facilities and converts electric energy into mechanical energy.

One or a plurality of sensors 11 is attached to the machine 1 for the purpose of monitoring an operation state thereof. In a case where the machine 1 is the electric motor, a current sensor that measures a current input into the electric motor, one or more vibration sensors that measures vibration of bearing of the electric motor or the like, a temperature sensor that measures a temperature around the bearing, and the like are attached to the machine 1. The sensor 11 measures the current, the vibration, the temperature, or the like at a predetermined time period, and supplies the measured data to the machine diagnostic apparatus 2 as the measurement data.

Hereinafter, each block configuring the machine diagnostic apparatus 2 will be described in detail with reference to FIG. 3 and subsequent figures in addition to FIG. 2. However, detailed description of the user IF unit 25 will be omitted. The user IF unit 25 is a block that controls to display a processing result in the abnormality diagnosis unit 23 or the operation mode data creation unit 24 to the display device 42, or controls to acquire data necessary for the display thereof or the like from the input device 41 such as the keyboard.

(Acquisition of Sensor Data)

The sensor data acquisition unit 21 (see FIG. 2) is connected to the sensor 11 attached to the machine 1 via a wired or wireless communication system (not illustrated). The measurement data of the current, the temperature, an acceleration, or the like which is measured by the sensor 11 and is supplied from the sensor 11 is received and is stored in the sensor data storage unit 31.

FIG. 3 is a diagram illustrating an example of a configuration of sensor data 311 stored in the sensor data storage unit 31. As illustrated in FIG. 3, the sensor data 311 is configured such that the measurement data that is measured by each sensor 11 attached to the machine 1 is associated with a measurement time.

In the example of the sensor data 311 of FIG. 3, the measurement data included in the sensor data 311 is, for example, the current, acceleration, and the temperature which are respectively measured by a current sensor, two vibration sensors, and a thermometer attached to the electric motor. In addition, in the example, all the measurement data are measured in a cycle of 0.1 second, but the measurement cycles of respective measurement data may be different from each other. For example, the current may be measured in a cycle of 0.1 second, the vibration may be measured in a cycle of 0.01 second, and the temperature may be measured in a cycle of 1 second.

In addition, the cycle in which the sensor 11 measures the measurement data may be different from a cycle in which the measurement data measured by the sensor 11 is transmitted to the sensor data acquisition unit 21. For example, the sensor 11 may measure the measurement data in the cycle of 0.1 second and supply the measurement data for one second to the sensor data acquisition unit 21 at once every second.

(Definition and Identification of Operation Mode)

FIG. 4 is a diagram illustrating an example of a configuration of operation mode data 321 stored in the operation mode data storage unit 32. As illustrated in FIG. 4, the operation mode data 321 is configured of data of items such as "operation mode name", "time", "amplitude", "frequency", and "operation mode ID". Here, the "operation mode name" is a name for identifying the operation mode appearing during operation of the machine 1, the "time" is a duration required for specifying the operation mode, the "sensor" is a name of the measurement data for specifying the operation mode, the "amplitude" is an amplitude value of the measurement data or an amount of a change of the amplitude value, the "frequency" is a frequency of the measurement data or an amount of a change of the frequency, the "operation mode ID" is a number or a symbol that identifies the operation mode.

The operation mode data 321 is data defining the operation mode of the machine 1 and is created by the operation mode data creation unit 24 (see FIG. 2). In addition, the operation mode data 321 is used when the operation mode specifying unit 22 specifies which operation mode the measurement data acquired by the sensor data acquisition unit 21 belongs to.

In the example of FIG. 4, the operation mode is specified by the measurement data of the current in the machine 1 (electric motor). For example, in a case where an amplitude of a current of a frequency of 50 Hz rises from 0 A to 10 A in 10 seconds, the operation mode is defined as "starting operation mode". In addition, in a case where a current of a frequency of 50 Hz maintains a constant amplitude 10 A in 3 seconds, the operation mode is defined as "steady operation mode". In addition, in a case where a frequency of a current having a constant amplitude 10 A is changed from 50 Hz to 80 Hz in 10 seconds, the operation mode is defined as "acceleration operation mode".

Figure 5A:
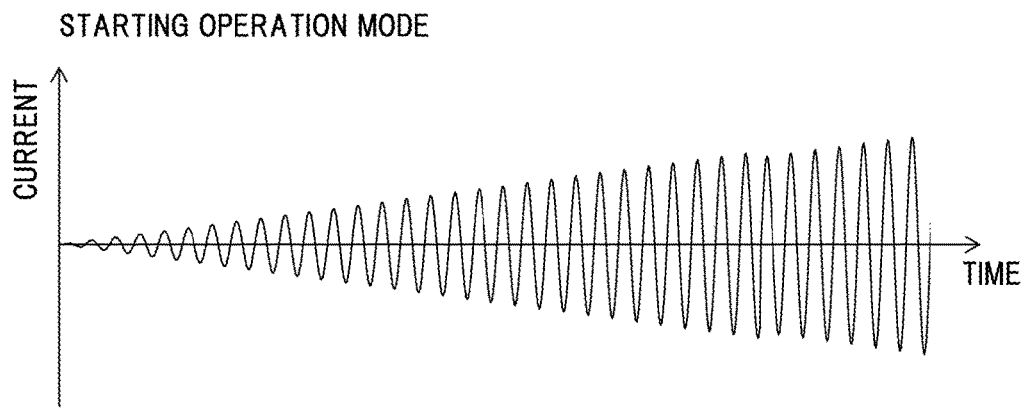
FIG. 5 is a diagram illustrating an example of a current waveform in each operation mode in a case where the machine is an electric motor, in which (a) is an example of the current waveform of a starting operation mode, (b) is an example of the current waveform of a steady operation mode, and (c) is an example of the current waveform of an acceleration operation mode.
Figure 5B:
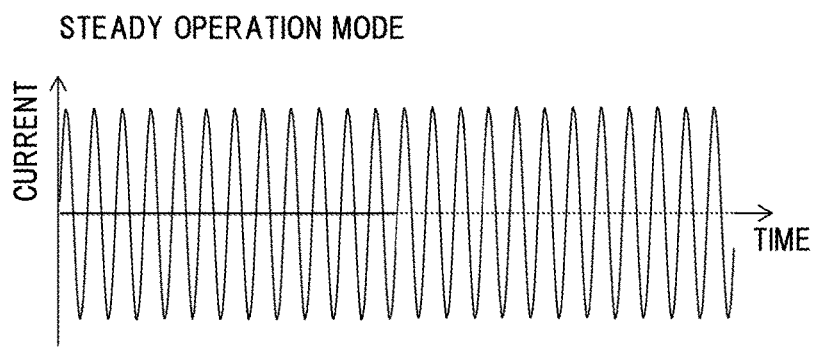
Figure 5C:
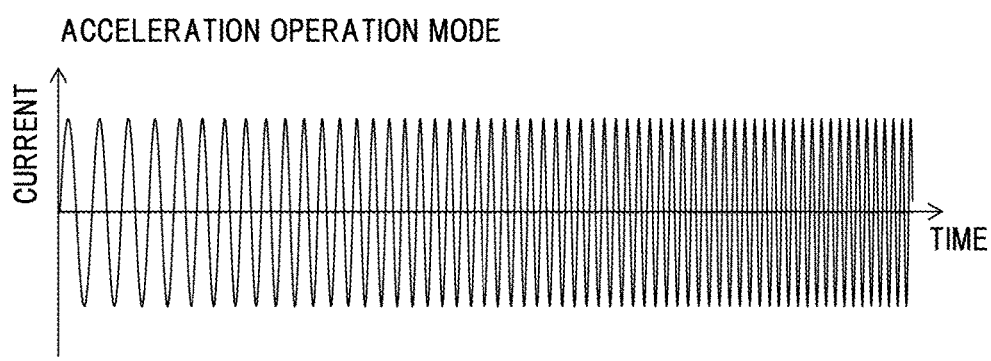

FIG. 5 is a diagram illustrating an example of a current waveform in each operation mode in a case where the machine 1 is the electric motor, in which (a) is an example of the current waveform of the starting operation mode, (b) is an example of the current waveform of the steady operation mode, and (c) is an example of the current waveform of the acceleration operation mode. As illustrated in FIG. 5(a), in the starting operation mode, although the frequency of the current is substantially constant, the amplitude of the current gradually increases from 0 A to a predetermined current value (for example, 10 A). In addition, as illustrated in FIG. 5(b), in the steady operation mode, the measurement value of the current, the amplitude, and the frequency are constant values. This represents a state where the electric motor is normally operated at a constant rotation speed. In addition, as illustrated in FIG. 5(c), in the acceleration operation mode, although the amplitude of the current is constant, the frequency gradually increases from 50 Hz to 80 Hz. This represents a state where the rotation speed of the electric motor gradually increases.

Moreover, the operation mode can be appropriately defined in addition to the operation mode illustrated in FIGS. 4 and 5. In a case where the machine 1 is the electric motor, a deceleration operation mode or a stop operation mode may be further provided. In addition, even in the steady operation mode, second and third the steady operation modes of which a frequency or an amplitude is different from each other may be provided.

In addition, the operation mode may be defined by a combination of a plurality of measurement data. For example, in addition to the current input into the machine 1, a surrounding temperature of the machine 1 may be used to define a starting operation mode at low temperature, the starting operation mode at normal temperature, or the like. However, for measurement data for a very long fluctuation time such as temperature, the "amplitude" in the operation mode data 321 of FIG. 4 is assumed to be the measurement data itself (temperature or the like). In addition, the "frequency" is not specifically fixed and is simply constant.

Above, although the examples of the operation mode illustrated in FIGS. 4 and 5 are simple examples, in general, the definition of the operation mode is not always possible for anyone. In particular, in a case where a control specification of the machine 1 is not disclosed, it is difficult to appropriately define the operation mode unless it is an expert who is familiar with the action or the operation of the machine 1. Thus, in the machine diagnostic apparatus 2 according to the embodiment, a mechanism for supporting the definition of the operation mode by expert intervention is incorporated as follows.

Figure 6:
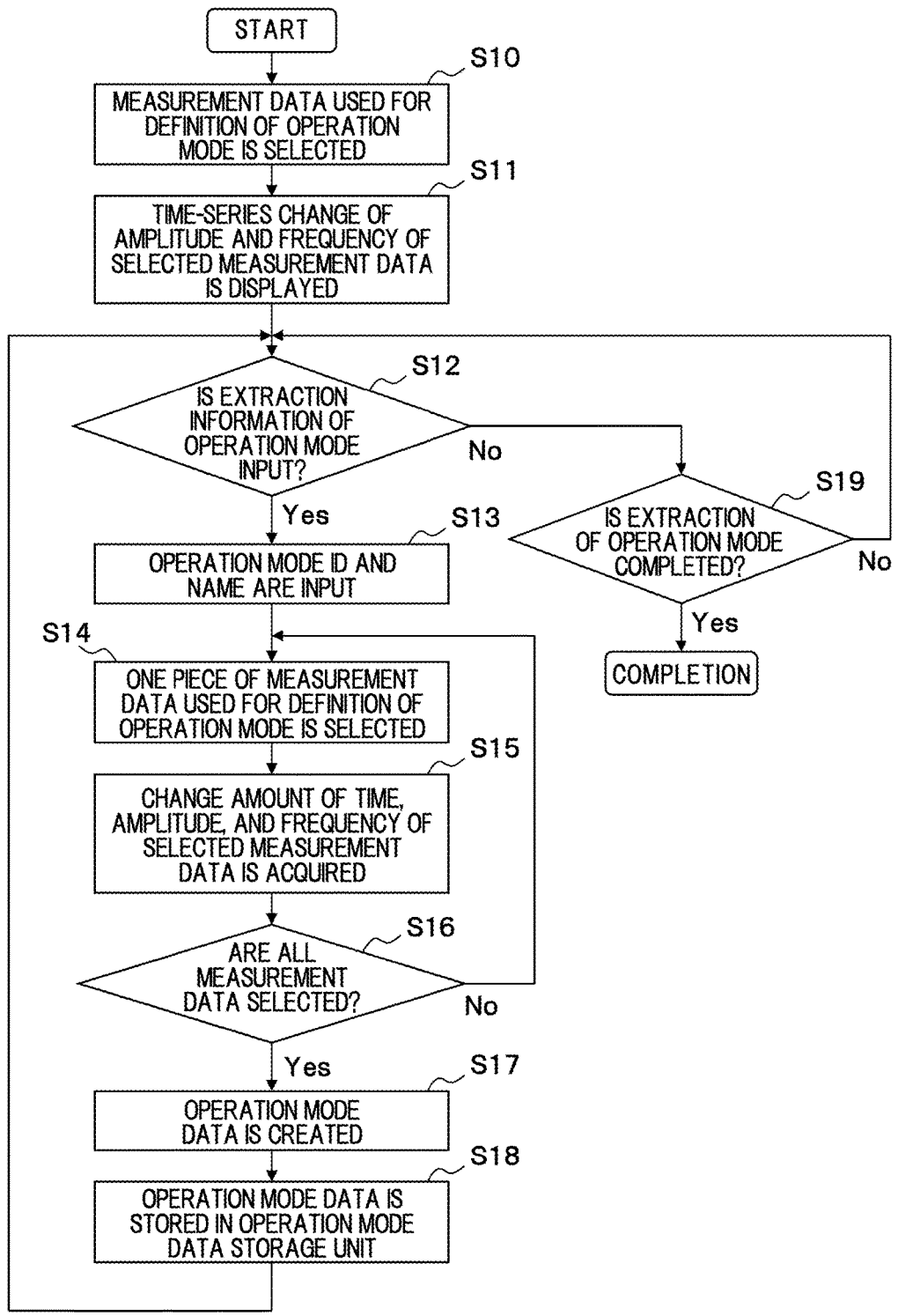
FIG. 6 is a diagram illustrating an example of a process flow executed by an operation mode data creation unit.

FIG. 6 is a diagram illustrating an example of a process flow executed by the operation mode data creation unit 24 and FIG. 7 is a diagram illustrating an example of an operation mode definition screen 50 displayed by the process in the operation mode data creation unit 24. As illustrated in FIG. 6, first, the operation mode data creation unit 24 selects the measurement data of the sensor 11 used for defining the operation mode based on data the expert input via the input device 41 (step S10). This processing may be one in which the expert selects the measurement data used for defining the operation mode from a name list of the measurement data of the sensor 11 displayed to a display screen (not illustrated) of the display device 42, or the expert directly inputs the name of the measurement data or the like via the input device 41 (key board or the like). Moreover, in the selection, in general, a plurality of types of measurement data can be selected.

Next, the operation mode data creation unit 24 reads data acquired in the past for the selected measurement data from the sensor data storage unit 31, and displays a time-series data of the measurement data and a time-series change in the amplitude and the frequency thereof to the display device 42 (step S11). Here, the amplitude means a value obtained from an envelope curve of the sensor data and the frequency means a frequency obtained by frequency analysis (frequency conversion) of the sensor data sorted in a predetermined time.

As illustrated in FIG. 7, for example, in the operation mode definition screen 50, time-series data of the current which is the selected measurement data, a time-series change in the amplitude and the frequency of the current are graphically displayed. Moreover, in the graph display, it is assumed that it is possible to appropriately display the time-series measurement data, the amplitude, and the frequency by scrolling and moving a time axis, or to display the time-series measurement data, the amplitude, and the frequency by compressing the time axis.

Thus, the expert familiar with the action and the operation of the machine 1 defines the operation mode of the machine 1 using the operation mode definition screen 50. First, the expert inputs extraction condition that defines a range of the operation mode to be defined on the operation mode definition screen 50 via the input device 41 such as a mouse cursor. Moreover, in the operation mode definition screen 50 of FIG. 7, the extraction condition of the operation mode is represented by broken-line rectangles 51.

In this case, as illustrated in FIG. 6, the operation mode data creation unit 24 determines whether or not the extraction condition (rectangle 51) of the operation mode is input from the input device 41 (step S12). In a case where the extraction condition (rectangle 51) of the operation mode is input (Yes in step S12), the operation mode data creation unit 24 further inputs the operation mode ID or the name thereof to be applied to the operation mode (step S13).

Description of Embodiments

For example, as illustrated in FIG. 7, in the operation mode definition screen 50, when the broken-line rectangle 51 that defines the range of the operation mode is input, a definition window 52 of the operation mode ID is also displayed in the operation mode definition screen 50. Input boxes 521 for inputting the operation mode ID of the operation mode, input boxes 522 for inputting the name of the operation mode, and the like are displayed in the definition window 52. Therefore, the expert can input the operation mode ID of the operation mode and the name of the operation mode via the input boxes 521 and 522 in the definition window 52.

Subsequently, the operation mode data creation unit 24 selects one piece of the measurement data used for defining the operation mode selected in step S10 (step S14). With respect to the selected measurement data, the amplitude and the frequency, and an amount of time change in the range included in the rectangle 51 for extracting the operation mode are acquired (step S15). For example, in the starting operation mode from time 0 to 10 seconds, information, in which the amplitude of the current increases from 0 A to 10 A, the frequency is constant at 50 Hz or the like, is acquired.

Next, the operation mode data creation unit 24 determines whether or not, in step S14, all the measurement data used for defining the operation mode are selected (step S16). In a case where all the measurement data are not selected yet (No in step S16), the processing of step S14 and step S15 is repeatedly executed. On the other hand, in a case where all the measurement data are selected (Yes in step S16), the operation mode data creation unit 24 collects the amplitude, the frequency, and the amount of time change for respective measurement data acquired in step S15 and creates the operation mode data regarding the operation mode (step S17). The created operation mode data is stored in the operation mode data storage unit 32 (step S18) and the processing of step S12 and thereafter is executed again.

In addition, in the determination of step S12, in a case where the extraction condition (rectangle 51) of the operation mode is not input (No in step S12) and the information for completing the extraction of the operation mode is also not input (No in step S19), the operation mode data creation unit 24 executes again the processing of step S12. On the other hand, in the determination of step S12, in a case where the extraction condition (rectangle 51) of the operation mode is not input (No in step S12) and information for completing the extraction of the operation mode is input instead (Yes in step S19), the operation mode data creation unit 24 completes the operation mode data creation process of FIG. 6. Moreover, in the operation mode definition screen 50 of FIG. 7, a "completion" button 53 is provided and here, when the "completion" button 53 is clicked, the information for completing the extraction of the operation mode is input.

In the operation mode data storage unit 32, the operation mode data regarding all the operation modes, that is, the operation mode data 321 (see FIG. 4) are created by the processing of the operation mode data creation unit 24 described above. The operation mode data 321 is used as reference data of each operation mode when the operation mode specifying unit 22 specifies the operation mode of the machine 1.

FIG. 8 is a diagram illustrating an example of a process flow executed by the operation mode specifying unit 22. As illustrated in FIG. 8, first, the operation mode specifying unit 22 acquires the time-series data of the measurement data used for defining the operation mode in the operation mode data 321 among the sensor data 311 (see FIG. 3) input via the sensor data acquisition unit 21 (step S31).

Next, the operation mode specifying unit 22 converts the time-series data of the acquired measurement data into the time-series data of the "amplitude" and the "frequency" (step S32). Moreover, the "amplitude" referred here maybe the time-series data itself of the measurement data in a case where a fluctuation cycle thereof is much larger than an actuation cycle (sampling cycle) of the measurement data and in this case, the conversion to the "amplitude" is not necessary.

Next, the operation mode specifying unit 22 refers to the operation mode data 321 stored in the operation mode data storage unit 32 and selects one piece of definition data of the operation mode among them (step S33).

Next, the operation mode specifying unit 22 compares the time-series data of the "amplitude" and the "frequency" of the measurement data obtained in step S32 with the definition data of the operation mode selected in step S33, more specifically, data (see FIG. 4) of columns of the "amplitude", the "frequency", and the "time" of the operation mode data 321 (step S34). As a result of the comparison, in a case where both match (Yes in step S35), the operation mode specifying unit 22 specifies that the operation mode in which the sensor data 311 corresponding to a matched time portion belongs is the operation mode that is selected in step S33 (step S36). As a result, since the operation mode ID is acquired, the processing of FIG. 8 is completed. Moreover, the operation mode ID that is acquired as described above is supplied to the abnormality diagnosis unit 23.

On the other hand, as a result of the comparison of step S34, in a case where both do not match (No in step S35), the operation mode specifying unit 22 further determines whether or not the definition data of all the operation modes is selected in the determination of step S33 (step S37). As a result of the determination, in a case where the definition data of all the operation modes is not selected yet (No in step S37), the procedure returns to step S33 and the processing of step S33 and thereafter is executed again.

In addition, in the determination of step S37, in a case where the definition data of all the operation modes is determined to be selected (Yes in step S37), the operation mode specifying unit 22 does not specify the operation mode and the processing of FIG. 8 is completed. Therefore, in this case, since the operation mode ID is not acquired, the processing in the subsequent abnormality diagnosis unit 23 is not performed.

As described above, the processing illustrated in FIG. 8 is processing of searching for whether or not the sensor data 311 successively acquired at a predetermined time cycle matches any of the definition data of each operation mode stored in the operation mode data storage unit 32.

(Abnormality Diagnosis of Machine 1)

The abnormality diagnosis unit 23 (see FIG. 2) performs abnormality diagnosis of the machine 1 when receiving the operation mode ID from the operation mode specifying unit 22. Hereinafter, details of the abnormality diagnosis performed by the abnormality diagnosis unit 23 will be described in detail with reference to FIGS. 9 to 13.

FIG. 9 is a diagram illustrating an example of a configuration of abnormality mode data 331 stored in the abnormality mode data storage unit 33. As illustrated in FIG. 8, the abnormality mode data 331 is configured by associating the "operation mode ID" and the "diagnosis procedure ID" with each "abnormality mode". Here, the "abnormality mode" is information for identifying abnormality or failure (hereinafter, simply referred to as abnormality) occurred in the machine 1 and in many cases, represents the mode of the abnormality or the site of occurrence thereof. In addition, the "operation mode ID" is information for indicating the operation mode in which the "abnormality mode" can occur. In addition, the "diagnosis procedure ID" is information for identifying the diagnosis procedure information for detecting the "abnormality mode".

In the example of the abnormality mode data 331 of FIG. 9, as the "abnormality mode", "scratch in inner ring of bearing" in which scratches occurs in the inner ring of the bearing of the electric motor, "scratch in outer ring of bearing" in which scratches occurs in the outer ring of the bearing, "deterioration in insulator of stator" in which the insulator of the stator of the electric motor is deteriorated, and the like are illustrated. Furthermore, the example of FIG. 9 illustrates that the abnormality mode that is the "scratch in inner ring of bearing" occurs in the operation mode in which the "operation mode ID" is "1" or "2", and the abnormality is detected by the diagnosis procedure in which the "diagnosis procedure ID" is "1".

Moreover, in the embodiment, the abnormality mode data 331 described above is data prepared in advance based on experience and results of the abnormality diagnosis in the past performed by the expert familiar with the action or operation of the machine 1. In addition, the "abnormality mode" is not limited to the example of FIG. 9.

FIG. 10 is a diagram illustrating an example of a configuration of diagnosis procedure information 341 stored in a diagnosis procedure information storage unit 34. As illustrated in FIG. 10, normally, a plurality of types of the diagnosis procedure information 341 are stored in the diagnosis procedure information storage unit 34 and respective diagnosis procedure information 341 is configured to include the "diagnosis procedure ID", the "sensor", "pre-processing", an "algorithm", "post-processing", or the like.

Here, the "diagnosis procedure ID" is information for identifying respective diagnosis procedure information 341 in the diagnosis procedure information storage unit 34. In addition, the "sensor" is a name of the measurement data used in the diagnosis procedure. In the example of FIG. 10, the diagnosis procedure is indicated in which "vibration A" and "temperature" are used.

The "pre-processing" is information for designating a process for being executed with respect to the measurement data designated in the "sensor" when applying the diagnosis algorithm. Examples of the "pre-processing" include filtering processing for noise removal, moving average processing, and the like. In addition, in a case where the measurement data is periodic data, frequency analysis processing or the like can be performed. Moreover, in the example of FIG. 10, as the "pre-processing", frequency analysis processing is performed on the measurement data of the "vibration A".

The "algorithm" is information for specifying an algorithm of the abnormality detection used in the diagnosis procedure. In the example of FIG. 10, as the "algorithm", it is indicated that cluster analysis of "K average method" is used and is stored in "cluster information is Datafile0" used in the cluster analysis as attached information. Moreover, as the algorithm of the abnormality detection, for example, "main component analysis" or the like may be used.

The "post-processing" is information for specifying conditions of abnormality determination used in processing of determination of the abnormality of the machine 1 after the algorithm of the abnormality detection is applied, or the like. In the example of FIG. 10, as the "post-processing", that is, as the conditions of the abnormality determination, it is indicated that an abnormality degree is 3 or more and continues 3 seconds or more.

Moreover, in the cluster analysis, n pieces of the measurement data designated in the "sensor" are acquired for each predetermined time so that an n-dimensional vector space is assumed in which the n pieces of the measurement data are components. In the n-dimensional vector space, cluster information is created using the measurement data having n components of each time acquired in the past. That is, the measurement data having the n components at each time is divided into each cluster in the n-dimensional vector space. In the embodiment, the cluster information (for example, Datafile0) is created by the operation mode of the machine 1.

In a case where there is measurement data that does not belong to any cluster among the measurement data measured by the sensor 11, it is considered that the measurement data is abnormality, that is, abnormality or a sign of abnormality appears in the machine 1.

In the cluster analysis, the "abnormality degree" is defined as a Euclidean distance between a position represented by the measurement data of each time and a center of the cluster closest to the position in the n-dimensional vector space. In the embodiment, the abnormality degree is calculated in the "post-processing" and in a case where the abnormality degree is 3 or more and 3 seconds or more, it is regarded as the abnormality of the machine 1.

The measurement data referred in the embodiment may be not only actual measurement data obtained from the sensor 11 but also data obtained by performing the "pre-processing" of the actual measurement data. For example, in a case where the "pre-processing" of the frequency analysis is performed for certain measurement data, the time-series data of a power value (spectrum value) of each frequency bandwidth of the measurement data is also regarded as measurement data of a cluster analysis target.

Figure 11:
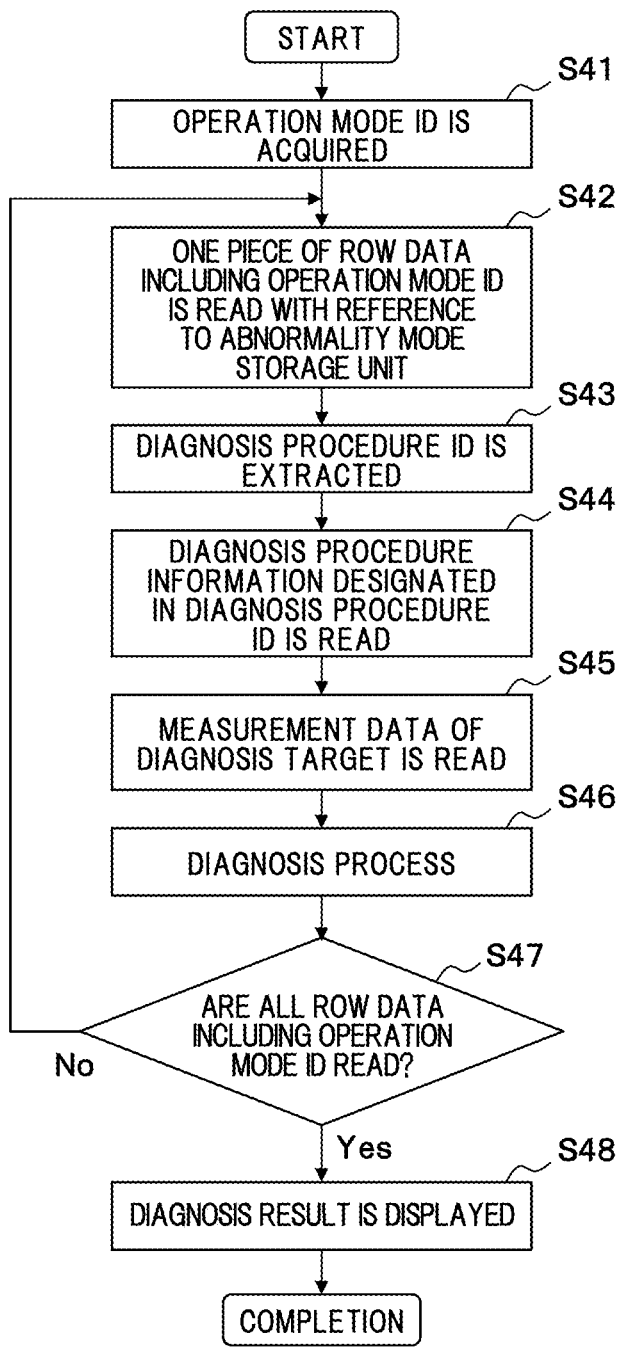
FIG. 11 is a diagram illustrating an example of a process flow of an abnormality diagnosis process executed by an abnormality diagnosis unit.

FIG. 11 is a diagram illustrating an example of a process flow of an abnormality diagnosis process executed by the abnormality diagnosis unit 23. As illustrated in FIG. 11, first, the abnormality diagnosis unit 23 acquires the operation mode ID supplied from the operation mode specifying unit 22 (step S41). For example, an operation mode ID "1" (starting operation mode: see FIG. 4) supplied from the operation mode specifying unit 22 is acquired.

Next, the abnormality diagnosis unit 23 refers the abnormality mode data 331 of the abnormality mode data storage unit 33 and selects one piece of row data including the operation mode ID (abnormality mode ID acquired in step S41) in the column of the "operation mode ID" (step S42). In the example of FIG. 9, the abnormality diagnosis unit 23 selects and reads one row among rows including "1" in the column of the "operation mode ID" of the abnormality mode data 331. For example, data (data in which the abnormality mode is "scratch in inner ring of bearing" and the diagnosis procedure ID is "1") on the first row is read.

Next, the abnormality diagnosis unit 23 extracts the diagnosis procedure ID included in the read abnormality mode data (step S43). In a case of the data of the first row of the abnormality mode data 331 of FIG. 9, "1" is read as the diagnosis procedure ID and it is understood that the diagnosis procedure designated by the diagnosis procedure ID "1" is a procedure for diagnosing the presence or absence of the abnormality mode that is "scratch in inner ring of bearing" from the data of the first row.

Next, the abnormality diagnosis unit 23 reads the diagnosis procedure information 341 that is designated by the diagnosis procedure ID from the diagnosis procedure information storage unit 34 (step S44) and reads the measurement data of the diagnosis target that is designated in the "sensor" column of the diagnosis procedure information 341 from the sensor data storage unit 31 (step S45). In a case of the example of the diagnosis procedure information 341 of FIG. 10, the measurement data of the "vibration A" and the "temperature" is read from the sensor data storage unit 31.

Next, the abnormality diagnosis unit 23 executes the diagnosis process by performing the "pre-processing", the "algorithm", and the "post-processing" designated by the diagnosis procedure information 341 with respect to the read measurement data of the diagnosis target (step S46). For example, in the example of the diagnosis procedure of FIG. 10, the abnormality diagnosis unit 23 performs pre-processing of the "frequency analysis" with respect to the measurement data of the "vibration A" and the cluster analysis of the "K average method" is performed with respect to the measurement data of the "vibration A" and the "temperature". The post-processing for detecting a case where the abnormality degree is 3 or more and continues 3 seconds or more as abnormality is performed based on the result of the cluster analysis.

Next, the abnormality diagnosis unit 23 determines whether or not all row data including the abnormality mode ID (abnormality mode ID acquired in step S41) are selected from the abnormality mode data 331 (step S47). Moreover, the determination is a process which is performed with respect to the processing result of step S42. Therefore, In the determination of step S47, in a case where all row data including the abnormality mode ID are not selected (No in step S47), the abnormality diagnosis unit 23 repeatedly performs the processing of step S42 and thereafter again.

On the other hand, in the determination of step S47, in a case where all row data including the abnormality mode ID are selected (Yes in step S47), the abnormality diagnosis unit 23 displays the diagnosis result obtained by the diagnosis process of step S46 to the display device 42 (step S48).

FIG. 12 is a diagram illustrating an example of a diagnosis result display screen 60 displayed to the display device 42 by the abnormality diagnosis unit 23. In a diagnosis result display process in the abnormality diagnosis process of FIG. 11 (step S48), the abnormality diagnosis unit 23 displays abnormality detected in the diagnosis process of step S46 as an abnormality occurrence situation list 61. The abnormality occurrence situation list 61 is configured to include an occurrence time of abnormality, the abnormality mode, the operation mode, and the abnormality degree, and data of each row is displayed each time the abnormality is detected.

Moreover, in the example of FIG. 12, for example, a case where the abnormality mode of the "scratch in inner ring of bearing" is detected at 15:05:00 on 27 Sep. 2014, the operation mode at that time is the "normal operation mode", and the abnormality degree is "10" is illustrated.

Figure 13:
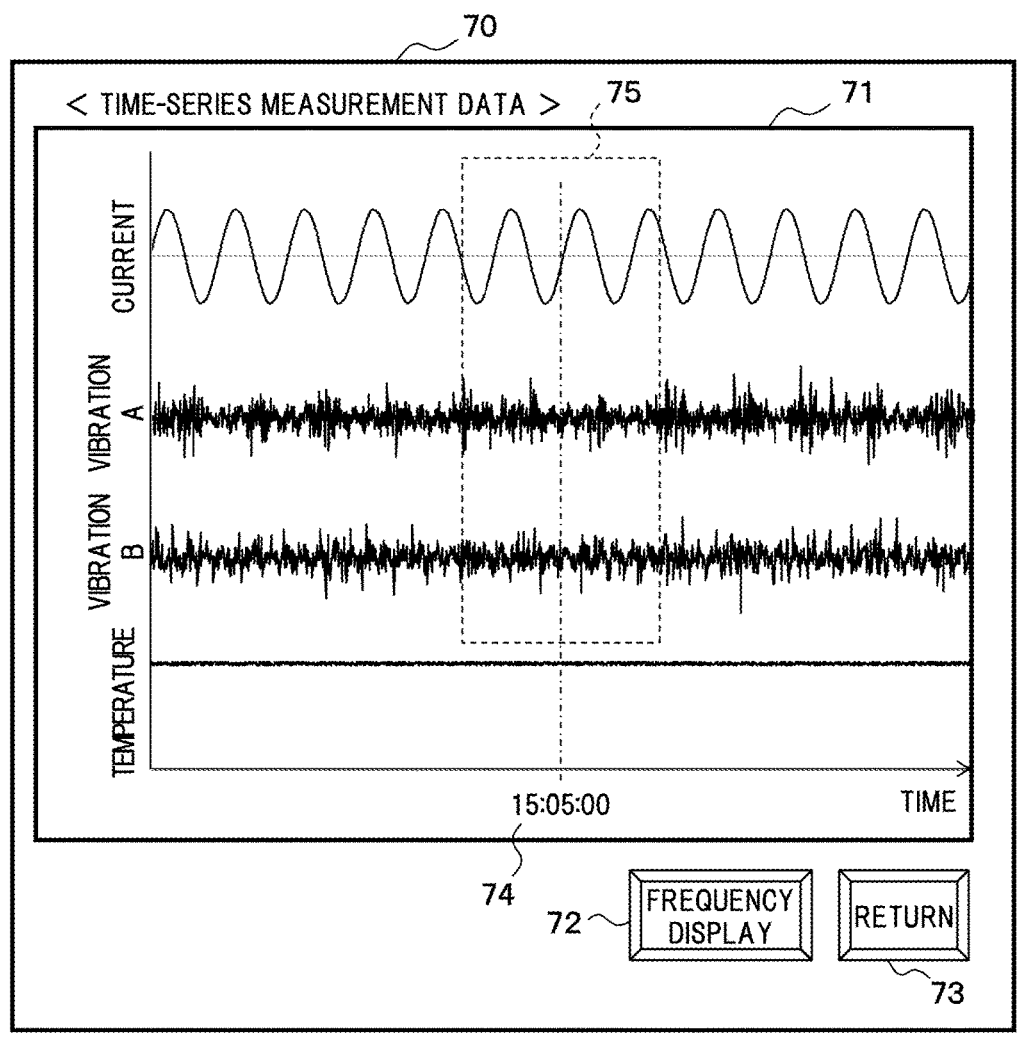
FIG. 13 is a diagram illustrating an example of a measurement data detail display screen displayed as a sub-screen of the diagnosis result display screen.

In addition, a "detail display" button 62 and a "completion" button 63 are displayed in the diagnosis result display screen 60, and when the "detail display" button 62 is clicked, a display screen as illustrated in FIG. 13 which is described below is displayed. On the other hand, when the "completion" button 63 is clicked, the diagnosis result display screen 60 in which the abnormality occurrence situation list 61 is displayed is closed.

FIG. 13 is a diagram illustrating an example of a measurement data detail display screen 70 displayed as a sub-screen of the diagnosis result display screen 60. As illustrated in FIG. 13, time-series measurement data 71, a "frequency display" button 72, and a "return" button 73 are displayed in the measurement data detail display screen 70. Here, the measurement data displayed as the time-series measurement data 71 includes the measurement data used for specifying the operation mode in addition to the measurement data that is the diagnosis target in the abnormality diagnosis process (step S14 of FIG. 11).

By the way, in the example of FIG. 13, as the measurement data that is the diagnosis target, the time-series measurement data 71 of the "vibration A", the "vibration B", and the "temperature" is displayed and as the measurement data used for specifying the operation mode, the time-series measurement data 71 of the "current" is displayed. Moreover, in this case, the time-series measurement data 71 is displayed as waveform data and a displayed time range can be appropriately stretched back and forth, for example, around an abnormality occurrence time 74. That is, in the measurement data detail display screen 70, the time-series measurement data 71 can be displayed for 1 second or can be displayed for 5 seconds, for example, before and after around the abnormality occurrence time 74.

Furthermore, a user can appropriately set a time window 75 of a frequency analysis target using the time-series measurement data 71 that is displayed in the measurement data detail display screen 70. In this case, when the user further clicks the "frequency display" button 72, the frequency analysis of the measurement data that is displayed in the time-series measurement data 71 is performed for a time range included in the time window 75 and a frequency analysis result display screen 80 illustrated in FIG. 14 which is described later is displayed in the display device 42. In addition, in this case, when the "return" button 73 is clicked, the measurement data detail display screen 70 of FIG. 13 is closed and the screen returns to the diagnosis result display screen 60 of an upper level.

Figure 14:
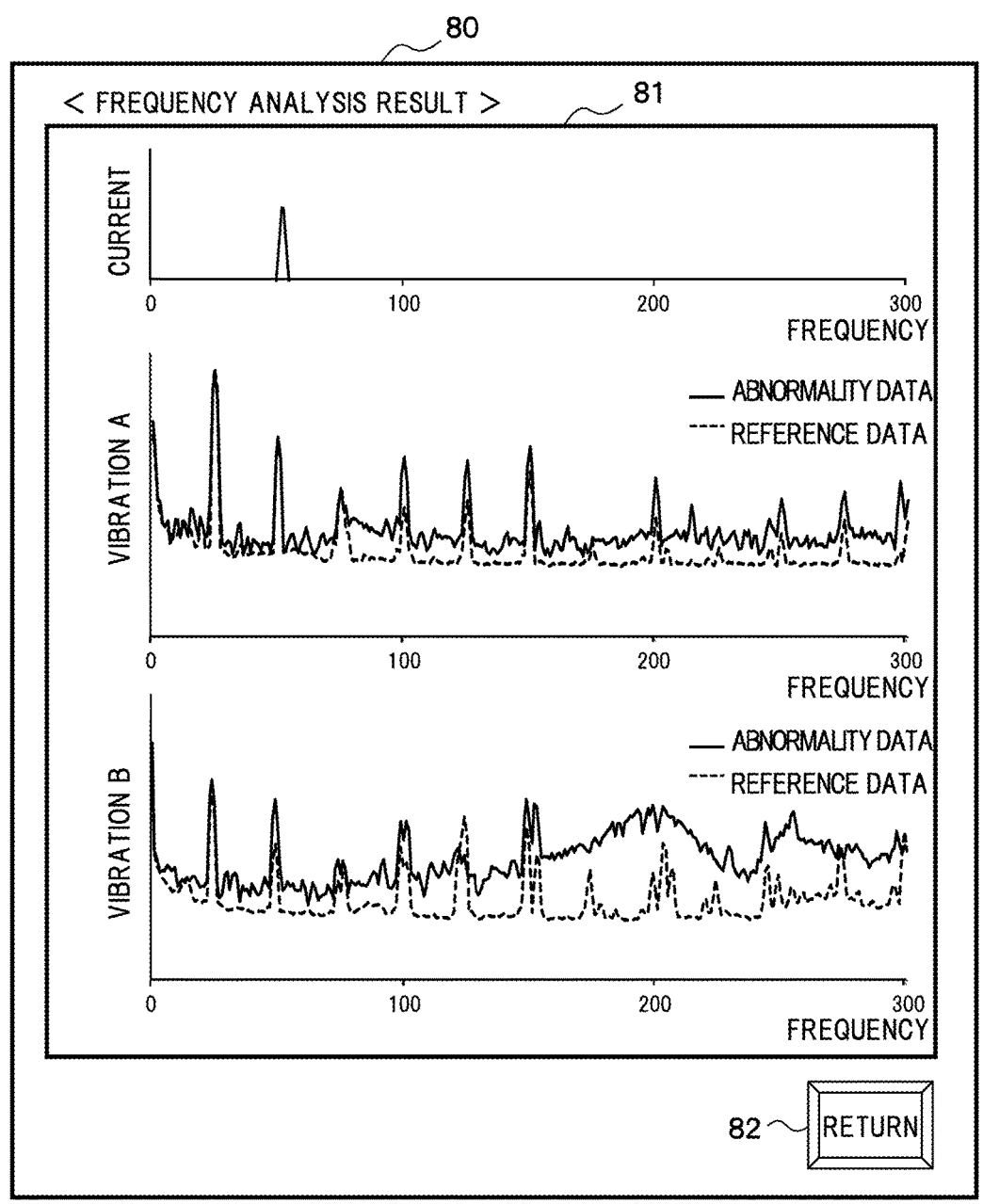
FIG. 14 is a diagram illustrating an example of a frequency analysis result display screen displayed as a sub-screen of the measurement data detail display screen.

FIG. 14 is a diagram illustrating an example of the frequency analysis result display screen 80 displayed as a sub-screen of the measurement data detail display screen 70. As illustrated in FIG. 14, in the frequency analysis result display screen 80, a frequency analysis result 81 on the time range designated by the time window 75 is displayed regarding the whole or a part of the time-series measurement data 71 as a target which is displayed in the measurement data detail display screen 70. In this case, in the frequency analysis result 81, the frequency is displayed in a horizontal axis and the power value (spectrum value) for each predetermined frequency bandwidth is displayed in a vertical axis.

Furthermore, here, for the sake of convenience of the user, data of the frequency analysis result for each of the time-series measurement data 71 in which the abnormality is detected and the time-series measurement data 71 in which the abnormality is not detected are displayed at the same time. In FIG. 14, the frequency analysis result of the time-series measurement data 71 in which the abnormality is detected is displayed by a solid line as "abnormality data" and the frequency analysis result of the time-series measurement data 71 in which the abnormality is not detected is displayed by a broken line as "reference data". Moreover, in this case, the displayed reference data is selected from data included in the cluster that is closest to the abnormality data, for example, in the cluster process of the diagnosis.

In addition, in the example of FIG. 14, it is understood that in the "current", while a stable spectrum value appears, for example, near 50 Hz, in the "vibration A" and the "vibration B", the spectrum value of the abnormality data is higher than the reference data over substantially the entire frequency bandwidth. Particularly, in the "vibration B", it is understood that there is a large difference between the spectrum values of both in the frequency bandwidth of 150 Hz or more. Such a difference in a behavior of the spectrum values occurs because there is some abnormality in the "vibration A" or the "vibration B".

Therefore, in the embodiment, in a case where the abnormality is detected in the diagnosis process, the user can promptly confirm a situation of the frequency bandwidth in which the abnormality data is different from the reference data by displaying the frequency analysis result display screen 80.

Moreover, in FIG. 14, in the frequency analysis result display screen 80, only the frequency analysis result 81 for one time range which is designated in the time window 75 (see FIG. 13) is displayed, but a plurality of frequency analysis results may be displayed in time series for each predetermined time range (for example, for one second).

In addition, in the frequency analysis result display screen 80, a "return" button 82 is displayed together with the frequency analysis result 81 and when the "return" button 82 is clicked, the frequency analysis result display screen 80 of FIG. 14 is closed and the screen returns to the measurement data detail display screen 70 of an upper level.

As described above in detail, first, the machine diagnostic apparatus 2 according to the embodiment specifies the operation mode of the machine 1 and determines whether or not the abnormality mode that can occur in the operation mode actually occurs based on the cluster analysis using the measurement data for each operation mode. Therefore, in the embodiment, in the measurement data from the sensor 11, since the abnormality diagnosis is performed separately for each operation mode, it is possible to reduce the false report or the report failure of the diagnosis result.

In addition, in the embodiment, the machine diagnostic apparatus 2 specifies the operation mode of the machine 1 using the measurement data obtained from the sensor 11. Therefore, the machine diagnostic apparatus 2 does not need to acquire information for identifying the operation mode from the control computer of the machine 1 or the like. Thus, the embodiment can also be applied to the existing machine 1 of which control specifications are unknown. That is, in the embodiment, it is not necessary to connect the machine diagnostic apparatus 2 to the control computer of the machine 1.

REFERENCE SIGNS LIST 1 machine
2 machine diagnostic apparatus
3 maintenance staff
4 manager
11 sensor
21 sensor data acquisition unit
22 operation mode specifying unit
23 abnormality diagnosis unit
24 operation mode data creation unit
25 user IF unit
31 sensor data storage unit
32 operation mode data storage unit
33 abnormality mode data storage unit
34 diagnosis procedure information storage unit
41 input device
42 display device
50 operation mode definition screen
60 diagnosis result display screen
70 measurement data detail display screen
80 frequency analysis result display screen

The invention claimed is:

1. A machine abnormality diagnostic apparatus for an existing machine when an operation mode is unknown comprising:
   a storage device;
   an input/output device;
   a display device; and
   a processor communicatively coupled to the storage device, the input/output device and the display device, wherein the processor:
   acquires via the input/output device, time-series measurement data measured by a sensor from the sensor attached to the existing machine having one or more operation modes;
   stores the time-series measurement data in the storage device;
   fits time-series measurement data into operation mode categories, wherein each operation mode category is defined by at least one extraction condition;
   determines whether the at least one extraction condition is input via the input/output device;
   selects one piece of time-series measurement data from the time-series measurement data for defining the one or more operation modes of the existing machine;
   acquires from the one piece of time-series measurement data amplitude, frequency and change of amount of time;
   determines if amplitude, frequency and change of amount of time for every piece of the time-series measurement data is acquired;

creates operation mode data using the acquired amplitude, frequency and change of amount of time for every piece of the time-series measurement data;
saves the operation mode data in the storage device;
acquires the time-series measurement data used for creating the operation mode data;
converts the time-series measurement data into time-series measurement data of amplitude and frequency;
compares the time-series measurement data of amplitude and frequency with the saved operation mode data;
specifies the operation mode of the existing machine when the comparison is a match and save the operation mode of the existing machine in the storage device;
wherein the storage device stores abnormality mode data which includes a plurality of abnormality modes, and each abnormality mode has at least one corresponding operation mode and a diagnosis procedure;
wherein the processor compares the operation mode of the existing machine to a matching operation mode found in the abnormality mode data;
selects the diagnosis procedure that corresponds to the matching operation mode; and
runs the selected diagnosis procedure on the time-series measurement data saved on the storage device to determine an abnormality of the time-series measurement data.

2. The machine diagnostic apparatus according to claim 1, wherein the processor via the display device displays the time-series data of the amplitude and the frequency of the time-series measurement data acquired in the past when creating the operation mode data, reads the extraction conditions for extracting each operation mode category that a user inputs based on the time-series data of the displayed amplitude and the frequency, and creates the operation mode data using information of a time period designated by the read extraction conditions and the time-series data of the amplitude and the frequency of the measurement data included in the time period.

3. The machine diagnostic apparatus according to claim 1, wherein when the abnormality of the machine is detected, the processor via the display device displays diagnosis result data configured to include the abnormality mode out of the plurality of abnormality modes and the operation mode of the existing machine that is specified at a time point at which the abnormality is detected.

4. The machine diagnostic apparatus according to claim 3, wherein the processor via the display displays the acquired time-series measurement data or a frequency analysis result thereof in a time range including a time point at which the abnormality is detected in a case where an input for selecting one piece of diagnosis result data among one or more pieces of diagnosis result data displayed in the display device is received.

5. A machine abnormality diagnostic method for an existing machine when an operation mode is unknown,
wherein a computer that is connected to a sensor attached to the existing machine executes:
a sensor data acquisition process of:
acquiring time-series measurement data measured by the sensor from the sensor, and
storing the time-series measurement data in a storage device;
an operation mode data creation process:
fitting time-series measurement data into operation mode categories, wherein each operation mode category is defined by at least one extraction condition,
determining whether the at least one extraction condition is input via an input/output device,
selecting one piece of time-series measurement data from the time-series measurement data for defining the one or more operation modes of the existing machine,
acquiring from the one piece of time-series measurement data amplitude, frequency and change of amount of time,
determining if amplitude, frequency and change of amount of time for every piece of the time-series measurement data is acquired,
creating operation mode data using the acquired amplitude, frequency and change of amount of time for every piece of the time-series measurement data, and
saving the operation mode data in the storage device;
an operation mode specifying process of:
acquiring the time-series measurement data used for creating the operation mode data,
converting the time-series measurement data into time-series measurement data of amplitude and frequency,
comparing the time-series measurement data of amplitude and frequency with the saved operation mode data, and
specifying the operation mode of the existing machine when the comparison is a match and save the operation mode of the existing machine in the storage device; and
an abnormality diagnosis process of:
storing abnormality mode data on the storage device, which includes a plurality of abnormality modes, and each abnormality mode has at least one corresponding operation mode and a diagnosis procedure,
comparing the operation mode of the existing machine to a matching operation mode found in the abnormality mode data;
selecting the diagnosis procedure that corresponds to the matching operation mode, and
running the selected diagnosis procedure on the time-series measurement data saved on the storage device to determine an abnormality of the time-series measurement data.

6. The machine diagnostic method according to claim 5, wherein in the operation mode data creation process, the computer displays the time-series data of the amplitude and the frequency of the time-series measurement data acquired in the past via the sensor data acquisition process to a display device when creating the operation mode data, reads the extraction conditions for extracting each operation mode that a user inputs based on the time-series data of the displayed amplitude and the frequency, and creates the operation mode data using information of a time period designated by the read extraction conditions and the time-series data of the amplitude and the frequency of the measurement data included in the time period.

7. The machine diagnostic method according to claim 6, wherein in the abnormality diagnosis process, when abnormality of the existing machine is detected, the computer displays diagnosis result data configured to include the abnormality mode out of the plurality of abnormality modes and the operation mode of the existing machine that is specified at a time point at which the abnormality is detected to the display device.

8. The machine diagnostic method according to claim 7, wherein in the abnormality diagnosis process, the computer further displays the time-series measurement data acquired by the sensor data acquisition process or a frequency analysis result thereof in a time range including a time point at which the abnormality is detected in a case where an input for selecting one piece of diagnosis result data among one or more pieces of diagnosis result data displayed in the display device is received.

* * * * *